United States Patent
Roh

(10) Patent No.: US 9,907,154 B2
(45) Date of Patent: Feb. 27, 2018

(54) DISPLAY APPARATUS AND ELECTRONIC APPARATUS HAVING HEAT SINK ASSEMBLY

(71) Applicant: SAMSUNG ELECTRONICS CO., LTD., Suwon-si (KR)

(72) Inventor: Woo Su Roh, Seongnam-si (KR)

(73) Assignee: SAMSUNG ELECTRONICS CO., LTD., Suwon-Si (KR)

(*) Notice: Subject to any disclaimer, the term of this patent is extended or adjusted under 35 U.S.C. 154(b) by 0 days.

(21) Appl. No.: 15/202,762

(22) Filed: Jul. 6, 2016

(65) Prior Publication Data

US 2017/0118832 A1    Apr. 27, 2017

Related U.S. Application Data

(60) Provisional application No. 62/246,851, filed on Oct. 27, 2015.

(30) Foreign Application Priority Data

Dec. 17, 2015    (KR) .................. 10-2015-0181138

(51) Int. Cl.
*H01L 23/40* (2006.01)
*H05K 1/02* (2006.01)
(Continued)

(52) U.S. Cl.
CPC .............. *H05K 1/021* (2013.01); *H01L 23/40* (2013.01); *H01L 24/32* (2013.01); *H05K 1/0254* (2013.01);
(Continued)

(58) Field of Classification Search
CPC ......... H05K 2201/10598; H05K 1/021; H05K 1/181; H05K 1/0254; H05K 7/20963; H05K 2201/10136; H01L 21/4882; H01L 23/40; H01L 2023/4037; H01L 2023/4043; H01L 2023/405; H01L 2023/4056; H01L 2023/4062; H01L 2023/4068;
(Continued)

(56) References Cited

U.S. PATENT DOCUMENTS

| | | | | |
|---|---|---|---|---|
| 6,061,240 A * | 5/2000 | Butterbaugh | ....... | H01L 23/4093 165/80.2 |
| 6,219,244 B1 * | 4/2001 | Chen | ................... | H01L 23/4093 165/185 |
| 6,301,113 B1 * | 10/2001 | Guerrero | ............. | H01L 23/4093 257/719 |
| 6,304,452 B1 * | 10/2001 | Lo | ....................... | H01L 23/4093 165/80.2 |

(Continued)

FOREIGN PATENT DOCUMENTS

KR    20030048744 A    6/2003

OTHER PUBLICATIONS

Communication dated Mar. 6, 2017, issued by the European Patent Office in counterpart European Application No. 16175570.7.

*Primary Examiner* — Adam B Dravinninkas
(74) *Attorney, Agent, or Firm* — Sughrue Mion, PLLC

(57) ABSTRACT

A display apparatus and an electronic apparatus including a heat sink assembly coupled to a printed circuit board (PCB) is disclosed. The display apparatus and the electronic apparatus include a PCB having a plurality of electronic components, a heat sink assembly coupled to the PCB, and a coupling member which couples the heat sink assembly and the PCB, wherein the coupling member includes a flexible metallic material and is oriented to elastically support the PCB and the heat sink assembly.

19 Claims, 16 Drawing Sheets

(51) Int. Cl.
   *H05K 7/20*      (2006.01)
   *H01L 23/00*     (2006.01)
   *H05K 1/18*      (2006.01)
   *G02F 1/1335*    (2006.01)
   *G02F 1/1368*    (2006.01)

(52) U.S. Cl.
   CPC ......... *H05K 1/181* (2013.01); *H05K 7/20963* (2013.01); *G02F 1/1368* (2013.01); *G02F 1/133514* (2013.01); *G02F 1/133528* (2013.01); *G02F 2201/123* (2013.01); *H01L 2224/32245* (2013.01); *H01L 2924/1432* (2013.01); *H05K 2201/10136* (2013.01)

(58) Field of Classification Search
   CPC ..... H01L 2023/4075; H01L 2023/4081; H01L 2023/4087; H01L 23/4093; H01L 2224/73265; H01L 2224/45015; H01L 2224/45124; H01L 24/32; H01L 2224/32245; H01L 2294/1432; G06F 1/20; G06F 1/1656; G06F 1/1637; G06F 1/1626; G06F 1/203; G06F 1/1632; G02F 1/133514; G02F 2201/123; G02F 1/1368; G02F 1/133528
   See application file for complete search history.

(56) References Cited

U.S. PATENT DOCUMENTS

| | | | | |
|---|---|---|---|---|
| 6,496,372 B1 * | 12/2002 | Davison | H01L 23/4093 | 165/80.3 |
| 6,666,640 B1 * | 12/2003 | Hsieh | F16B 5/065 | 165/80.3 |
| 6,865,083 B2 * | 3/2005 | Liu | H01L 23/4093 | 165/80.2 |
| 8,941,996 B2 * | 1/2015 | Chiang | H05K 1/0203 | 165/185 |
| 2006/0039119 A1 * | 2/2006 | Karuishi | H05K 7/1431 | 361/719 |
| 2006/0044745 A1 * | 3/2006 | Kim | G06F 1/1601 | 361/679.22 |
| 2007/0097653 A1 * | 5/2007 | Gilliland | H01L 23/552 | 361/719 |
| 2009/0126903 A1 | 5/2009 | Kuibira et al. | | |
| 2009/0135566 A1 | 5/2009 | Choi et al. | | |
| 2010/0027220 A1 | 2/2010 | Hughes et al. | | |
| 2010/0073596 A1 * | 3/2010 | Jeong | G02F 1/133308 | 349/60 |
| 2014/0016272 A1 * | 1/2014 | Chiang | H05K 1/0203 | 361/720 |
| 2014/0161399 A1 * | 6/2014 | Hsieh | G02B 6/4269 | 385/92 |

* cited by examiner

DISPLAY APPARATUS AND ELECTRONIC APPARATUS HAVING HEAT SINK ASSEMBLY

CROSS-REFERENCE TO RELATED APPLICATIONS

This application claims the benefit of U.S. Provisional Patent Application No. 62/246,851, filed on Oct. 27, 2015, and priority to Korean Patent Application No. 10-2015-0181138, filed on Dec. 17, 2015 in the Korean Intellectual Property Office, the disclosures of which are incorporated herein by reference in their entireties.

BACKGROUND

1. Field

Exemplary embodiments of the present disclosure relate to a display apparatus and an electronic apparatus including a heat sink assembly with an improved assembly structure.

2. Description of the Related Art

Electronic apparatuses such as a mobile phone, a laptop computer, a display apparatus, or the like may be provided with a printed circuit board (PCB) and electronic components installed thereon. As the performance and miniaturization of electronic apparatuses are advanced, various kinds of electronic components can be highly integrated and provided on the PCB.

The PCB is formed by printing a pattern of a circuit line on an electrically insulating substrate using a conductive material such as copper, and refers to a substrate right before electronic components are mounted thereon. As integration densities of the electronic components provided on the PCB increase, a high temperature heat may be generated at the electronic components. A temperature increase at the electronic components may become a cause of trouble or a fault of the electronic components.

Therefore, the PCB may be provided with a metallic material having a high thermal conductivity to efficiently radiate the heat generated at the electronic components. The heat generated at the electronic components may be transferred to the PCB and radiated efficiently.

A case of an electronic component corresponding to a central processing unit (CPU) which controls an operation of the electronic apparatus can generate further amounts of heat as compared to other electronic components. When the heat generated at the CPU is transferred to the PCB, the high temperature heat may be transferred to other electronic components installed on the PCB.

A heat sink assembly may be coupled to the PCB so that heat from the electronic components is efficiently radiated. Particularly, the heat sink assembly can be provided to quickly radiate the heat generated from the electronic component corresponding to the CPU.

In a conventional case, the PCB and the heat sink assembly are coupled by a fixing member that couples therebetween. The fixing member equipped with a spring buffers an impact applied to the heat sink assembly and prevents electronic components from being damaged due to a bumping between the heat sink assembly and the electronic components even when the electronic apparatus is moved by an external force.

SUMMARY

Therefore, it is an aspect of the present disclosure to provide a display apparatus and an electronic apparatus including a heat sink capable of being easily assembled with a printed circuit board (PCB) by a coupling member with an improved structure.

It is another aspect of the present disclosure to provide a display apparatus and an electronic apparatus capable of preventing electrostatic discharge by a heat sink assembly coupled to a PCB.

Additional aspects of the disclosure will be set forth in part in the description which follows and, in part, will be obvious from the description, or may be learned by practice of the disclosure.

In accordance with one aspect of the present disclosure, an electronic apparatus includes a PCB including a plurality of electronic components, a heat sink assembly coupled to the PCB, and an elastically deformable coupling member which couples the heat sink assembly and the PCB, wherein the elastically deformable coupling member includes a flexible metallic material, and is oriented to elastically support the PCB and the heat sink assembly.

The coupling member may be provided so that a diameter thereof is contractible by an external force.

A fixing portion at which the coupling member is installed may be formed protruding from the heat sink assembly.

A space into which the coupling member is inserted may be formed between the fixing portion and the heat sink assembly.

An opening through which the coupling member passes may be formed at the fixing portion.

A diameter of the opening may be formed to be less than the diameter of the coupling member.

The coupling member may be inserted into the space formed between the fixing portion and the heat sink assembly to elastically support the heat sink assembly.

The coupling member may be installed on the PCB.

The coupling member may include a base installed at the PCB, and a support portion installed at the base and installed on the heat sink assembly to support one surface of the heat sink assembly.

The support portion may be provided in a form of a closed loop of a polygonal shape.

The support portion may be provided in a ring shape.

The support portion may be provided in a form of an open loop of a hook shape.

The coupling member may be provided with the same metallic material as that of the PCB.

A plurality of contact members protruding from the PCB may be provided, and the contact members may be provided to be in contact with one surface of the heat sink assembly when the PCB and the heat assembly are coupled.

An integrated circuit (IC) member serving as a central processing unit may be provided on the PCB, and the coupling member may be located adjacent to the IC member.

The IC member and the heat sink assembly may be coupled by an adhesive member.

In accordance with another aspect of the present disclosure, a display apparatus includes a display panel fixed between a first chassis and a second chassis; a printed circuit board including a plurality of electronic components and located on an opposite side of the second chassis as the display panel, a heat sink assembly configured to radiate heat of the PCB, and an elastically deformable coupling member which couples the heat sink assembly and the PCB, wherein the elastically deformable coupling member includes a flexible metallic material, and is oriented to elastically support the heat sink assembly.

A fixing portion may be formed protruding from the heat sink assembly, and the coupling member may be installed at the fixing portion.

An opening through which the coupling member passes may be formed at the fixing portion.

A diameter of the opening may be less than a diameter of the coupling member.

BRIEF DESCRIPTION OF THE DRAWINGS

These and/or other aspects of the disclosure will become apparent and more readily appreciated from the following description of the exemplary embodiments, taken in conjunction with the accompanying drawings of which.

DETAILED DESCRIPTION

Figure 1:
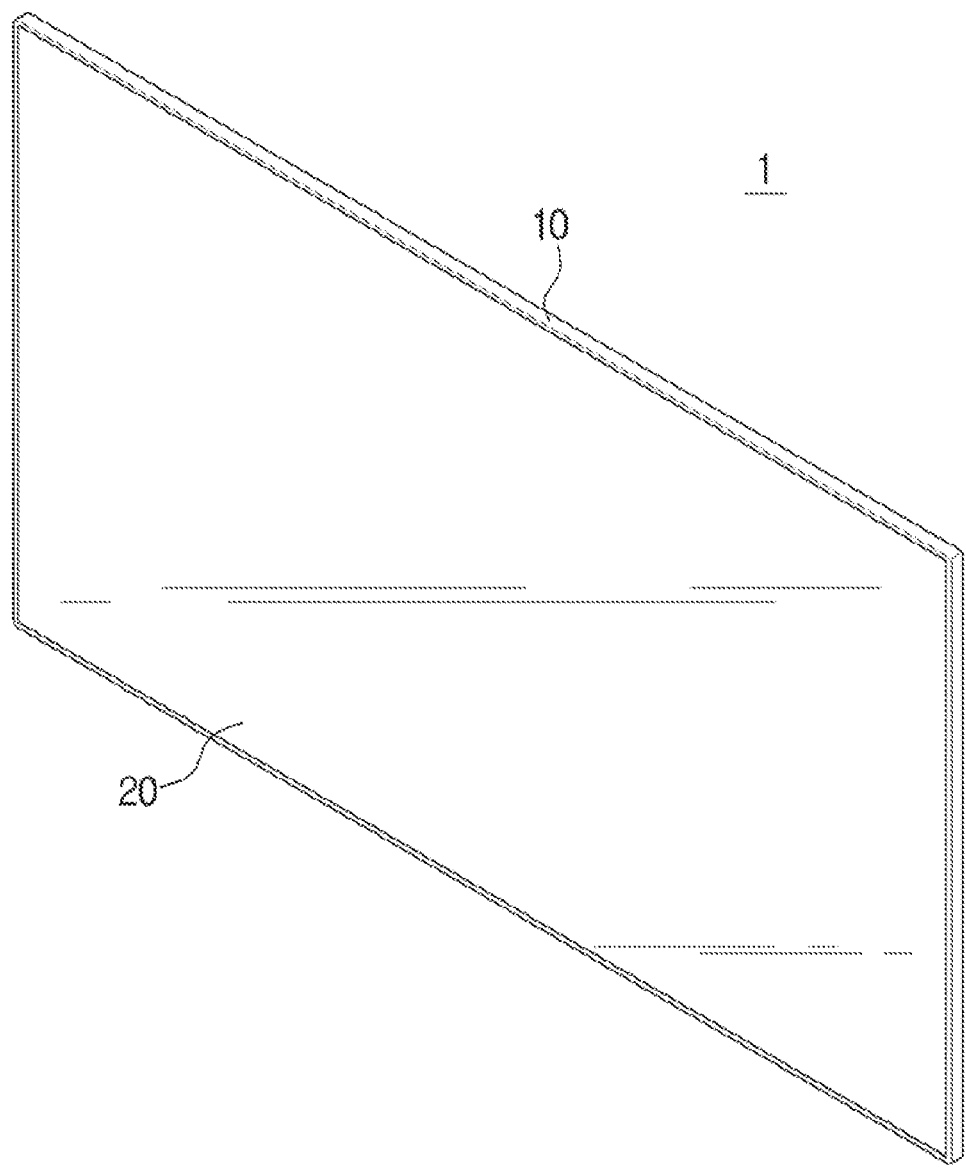
FIG. 1 is a perspective view illustrating a display apparatus in accordance with one exemplary embodiment.

Hereinafter, a display apparatus and an electronic apparatus including a heat sink assembly according to the exemplary embodiments of the present disclosure will now be described in detail with reference to the accompanying drawings, wherein like reference numerals refer to like elements throughout. Although exemplary embodiments of the heat sink assembly applied to a display apparatus are described below, the heat sink assembly may be provided not only for a display apparatus but also for various kinds of electronic apparatuses which require heat radiation.

Figure 2:
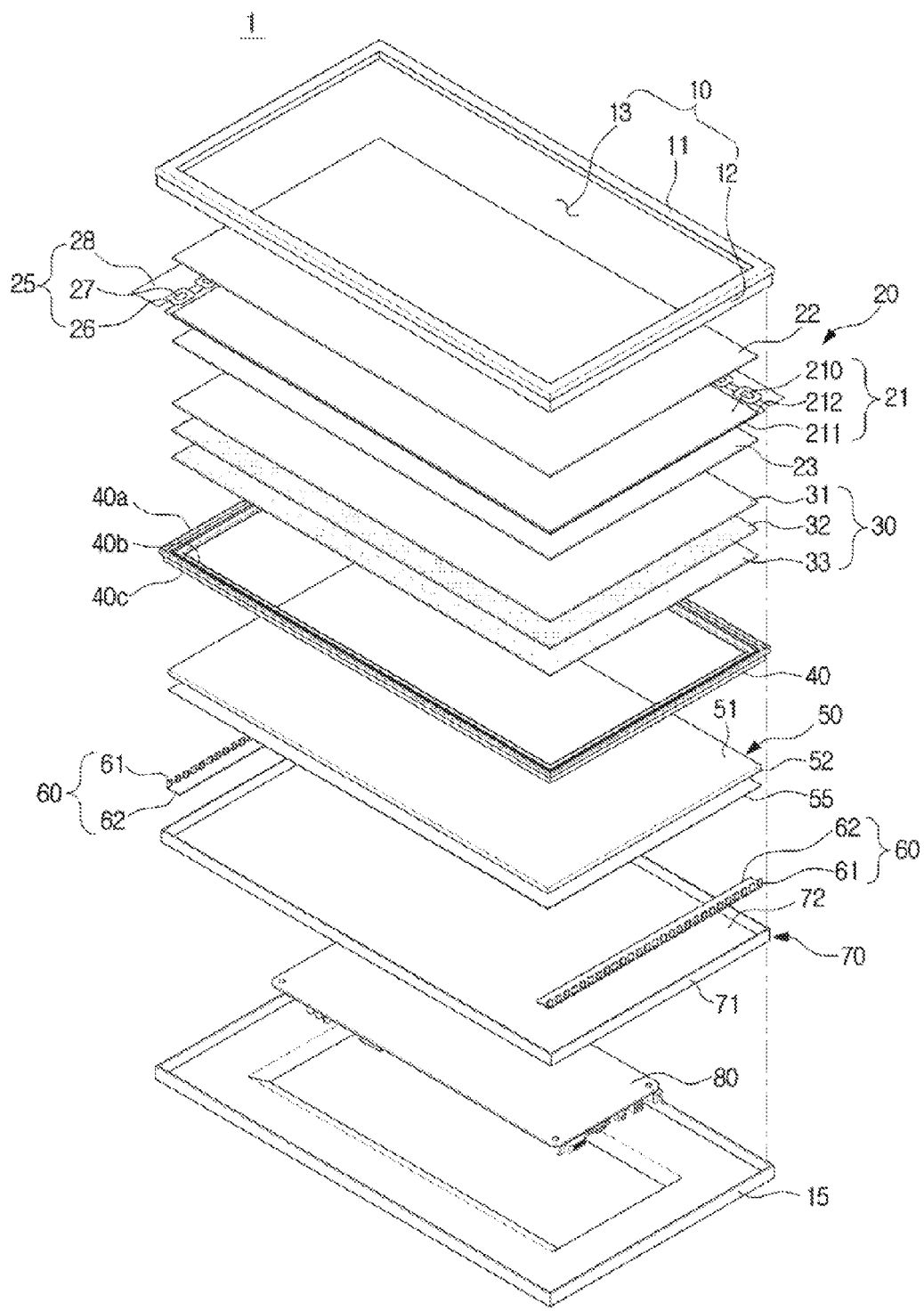
FIG. 2 is an exploded perspective view illustrating the display apparatus in accordance with one exemplary embodiment.

FIG. 1 is a perspective view illustrating a display apparatus in accordance with one exemplary embodiment, and FIG. 2 is an exploded perspective view illustrating the display apparatus in accordance with one exemplary embodiment.

Referring to FIGS. 1 and 2, a display apparatus 1 in accordance with one exemplary embodiment of the present disclosure includes a top chassis 10, a display panel 20, a backlight unit 60, and a bottom chassis 70. The top chassis 10 is disposed in front of the display panel 20. The backlight unit 60 is disposed separately at the rear of the display panel 20. The bottom chassis 70 may be disposed at the rear of the display panel 20 and the backlight unit 60.

A middle mold 40 may be further provided between the display panel 20 and the backlight unit 60. The middle mold 40 may separate the display panel 20 from the backlight unit 60 and support the display panel 20 and the backlight unit 60. A printed circuit board (PCB) 80 capable of controlling driving of the display apparatus 1 may be disposed at the rear of the bottom chassis 70. A rear cover 15 which forms an exterior of the display apparatus 1 may be provided at the rear of the PCB 80.

A plurality of optical sheets 30 may be provided at the rear of the display panel 20. A light guide plate 50 may be disposed at the rear of the optical sheets 30. A reflection sheet 55 may be disposed at the rear of the light guide plate 50.

The optical sheets 30 include a protective film 31, a prism film 32, and a diffusion film 33. The protective film 31 is disposed in front of the prism film 32 to protect the prism film 32 which is sensitive to a scratch from dust and the like.

A triangular-prism-shaped prism may be disposed on a front surface of the prism film 32. Light diffused at the diffusion film 33 may be concentrated at a rear surface of the display panel 20 in front of the diffusion film 33 in a perpendicular direction due to the prism film 32. Two prism films 32 may be used. The light passing through the prism film 32 proceeds perpendicularly to the display panel 20 so that the display panel 20 may have a uniform luminance. The light passing through the light guide plate 50 may be diffused and supplied to the display panel 20 by the diffusion film 33.

The light guide plate 50 may uniformly supply the light emitted from a light emitting diode (LED) 61 to the diffusion film 33. The light guide plate 50 may include a light emitting surface 51 and a light incident surface 52. The light emitting surface 51 is disposed at the rear of the diffusion film 33 and may face one surface of the diffusion film 33. The light incident surface 52 is provided at a lateral end surface so that the light emitted from the LED 61 may be incident thereto.

A reflection sheet 55 may be disposed at the rear of the light guide plate 50. The light emitted from a rear surface of the light guide plate 50 may be guided back to the light guide plate 50 by the reflection sheet 55.

The backlight unit 60 includes a plurality of LEDs 61 and a PCB 62. The LED 61 may provide light to the light guide plate 50. The plurality of LEDs 61 may be mounted on the PCB 62.

The plurality of LEDs 61 are mounted protruding from one surface of the PCB 62. The plurality of LEDs 61 are separated by a predetermined distance and disposed on the one surface of the PCB 62.

The PCB 62 may be disposed at the rear of the reflection sheet 55. The PCB 62 may be fixed to the bottom chassis 70 by a fastening member such as a screw or an adhesive method such as a double-sided tape. A rear surface of the PCB 62 on which the plurality of LEDs 61 are mounted may be fixed to a bottom surface 72 of the bottom chassis 70.

The display panel 20 may include a first substrate 211 which has a thin film transistor (TFT) and a pixel electrode, and a second substrate 210 which is disposed at a side of the first substrate 211 and has a color filter and a driving source.

A liquid crystal layer 212 may be provided between the first substrate 211 and the second substrate 210. At a lower surface of the first substrate 211 or an upper surface of the second substrate 210, polarizing sheets 22 and 23 may be attached. A module that combines the first substrate 211, the second substrate 210, and the liquid crystal layer 212, is referred to as a liquid crystal display module 21.

A drive unit 25 for applying a drive signal may be provided at a side of the first substrate 211. The drive unit 25 may include a flexible PCB 26, a drive chip 27, and a circuit board 28. The drive chip 27 may be installed on one side of the flexible PCB 26. The circuit board 28 may be connected to the other side of the flexible PCB 26.

A black matrix may be formed at the second substrate 210. A cable, which connects the drive unit 25 and the PCB 80, and the like may be disposed using a rear space of the black matrix.

The display panel 20 may form a screen by controlling an alignment of the liquid crystal layer 212. The display panel 20, which is a non-luminous device, may display an image by receiving light from the backlight unit 60.

The top chassis 10 may include a bezel 11 and a top lateral surface 12. The bezel 11 may surround a top edge of the display panel 20. The top lateral surface 12 may be provided by bending an end portion of the bezel 11 in a rearward direction. At least a part of the top lateral surface 12 may be in contact with the bottom chassis 70. For example, at least a part of the top lateral surface 12 may cover an outer surface of a bottom lateral surface 71.

An opening 13 for exposing the display panel 20 may be formed at the top chassis 10. Through the opening 13, an effective display area which actually displays a screen at the display panel 20 may be exposed forward.

The bottom chassis 70 may include the bottom lateral surface 71 and the bottom surface 72. The bottom lateral surface 71 may protrude forward and extend along a circumference of the bottom surface 72. The backlight unit 60 may be mounted on the bottom surface 72. A heat sink sheet (not shown) may be disposed at the rear of the bottom surface 72 of the bottom chassis 70.

The middle mold 40 may include a first support portion 40a, a second support portion 40b and an extension portion 40c. The first support portion 40a and the second support portion 40b may be formed extending to the inside of the middle mold 40. The second support portion 40b extends inwardly from the first support portion 40a, and may be formed to have a step in a rearward direction from the first support portion 40a. The extension portion 40c extends in a rearward direction of the middle mold 40. A part of the display panel 20 may be supported by the first support portion 40a. A part of the optical sheets 30 may be supported by the second support portion 40b. A lateral surface of the extension portion 40c may be in contact with an inner side of the bottom chassis 70.

The LED 61 may simultaneously radiate light and heat. The PCB 62 may serve not only the role of providing a drive signal to the LED 61, but also the role of transferring heat generated from the LED 61 to the outside. That is, the heat generated from the LED 61 may be transferred to the bottom chassis 70 through the PCB 62. The PCB 62 may be made of a metal having a high thermal conductivity to increase a heat transfer rate. For example, the PCB 62 may be made of a metallic material including aluminum, copper, or the like.

The PCB 80 may be installed at the rear of the bottom chassis 70. The rear cover 15 may be disposed at the rear of the PCB 80. The PCB 80 may include the circuit board and a plurality of electronic components installed on the circuit board. The electronic components may be installed on a front surface or the rear surface of the circuit board. The plurality of electronic components may be mounted or fixed by a clamp to the circuit board.

A large amount of heat may be generated from the electronic components installed on the PCB 80. The PCB 80 may be provided with a metal having a high thermal conductivity that may receive the heat generated by the electronic components. The PCB 80 may have a large surface area to radiate the heat generated from the electronic components.

Among the electronic components provided on the PCB 80, an integrated circuit (IC) member 81 (see FIG. 3) corresponding to a central processing unit (CPU) that controls an operation of the display apparatus 1 may be provided. Information associated with the operation of the display apparatus 1 is input to the IC member 81, which serves to control the operation of the display apparatus 1 according to the input signal.

Many electronic components provided on the PCB 80 may generate electromagnetic waves. Electromagnetic waves and static electricity may influence operations of the electronic components unless the electromagnetic waves and the static electricity are discharged suitably. Particularly, since the IC member 81 controls an overall operation of the display apparatus 1, when trouble occurs at the IC member 81 by the electromagnetic waves, it may have a negative influence on the control of the display apparatus 1.

Accordingly, electromagnetic waves need to be radiated suitably so that trouble does not occur in the electronic components including the IC member 81 due to the electromagnetic waves generated at the side of the PCB 80.

In addition, the IC member 81 may generate a higher temperature heat than other electronic components.

The heat generated at the IC member 81 may be radiated through the PCB 80, but the heat generated at the IC member 81 may be difficult to fully radiate through the PCB 80 alone. The high temperature heat generated at the IC member 81 may be transferred to the PCB 80, which may transfer the heat to the other electronic components on the PCB 80, thereby increasing temperatures at other components.

As the display apparatus 1 becomes slimmer, the size of the PCB 80 necessarily becomes smaller as well, and the electronic components on the PCB 80 may be provided with a high integration density. According to the high integration density of the electronic components, heat generation per unit area may be increased further than those in conventional electronic components. Therefore, temperatures of the highly integrated electronic components may be increased quickly.

When temperatures of the electronic components rise, the possibility of a malfunction or trouble in the electronic components may be increased. Therefore, quick heat radiation is necessary so that the temperatures at the electronic components do not rise to be equal to or higher than a predetermined value.

The heat may be radiated to some extent because the PCB 80 on which the electronic components are installed is provided with a metallic material, but the high temperature heat generated at the highly integrated electronic components may not be radiated enough therethrough.

Therefore, a heat sink assembly 90 (see FIG. 3) capable of effectively radiating the heat generated at the IC member 81 may be provided on the PCB 80. The heat sink assembly 90 may be provided to be in contact with the IC member 81 to effectively radiate the heat generated at the IC member 81 provided on the PCB 80.

To prevent the IC member 81 from being damaged due to a bumping between the heat sink assembly 90 and the IC member 81 when the display apparatus 1 is moved, the heat sink assembly 90 and the PCB 80 may be installed so that an external impact is buffered. The heat sink assembly 90 and the PCB 80 may be coupled by a coupling member 82 having elasticity.

Hereinafter a structure in which the heat sink assembly 90 is installed on the PCB 80 by the coupling member 82 will be described.

Figure 3A:
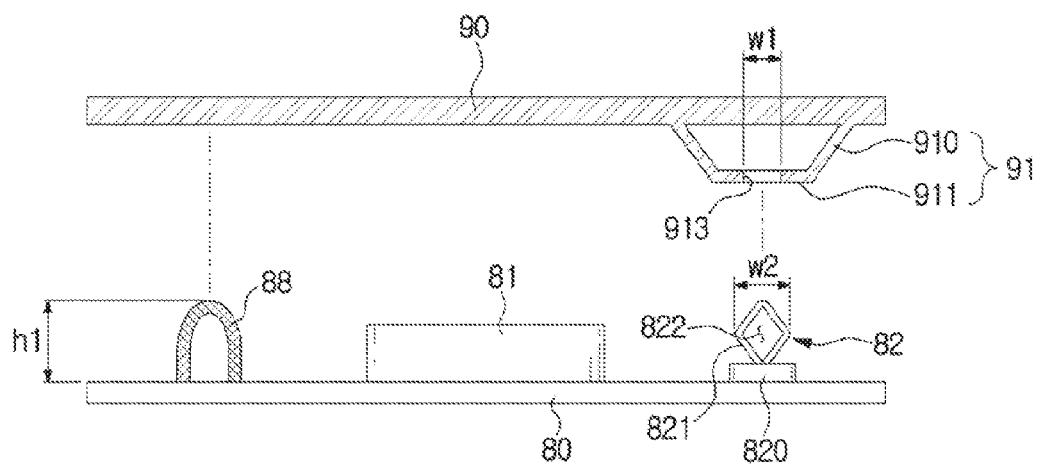
FIGS. 3A, 3B, and 3C are views illustrating how a heat sink assembly and a printed circuit board (PCB) are assembled in accordance with one exemplary embodiment.
Figure 3B:
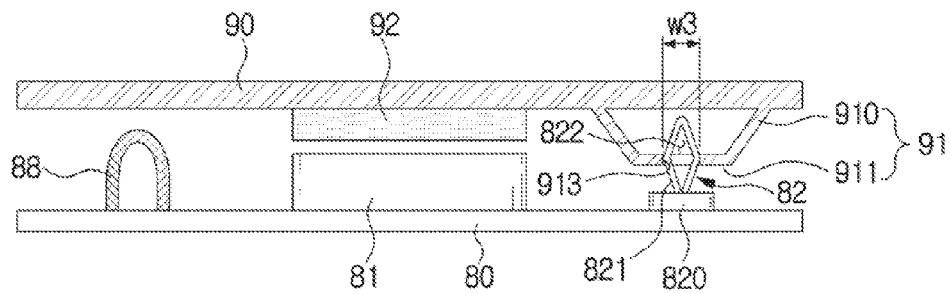
Figure 3C:
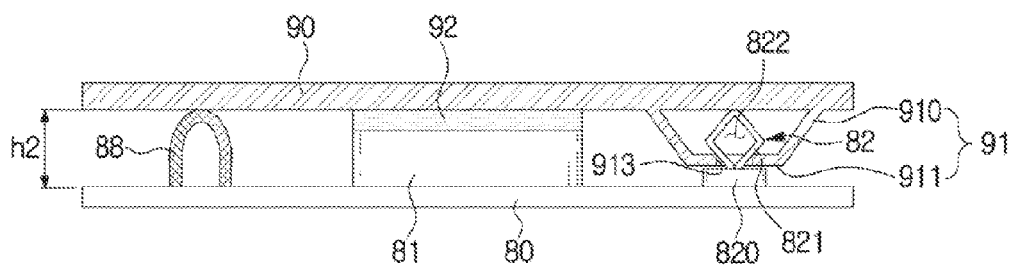
Figure 4:
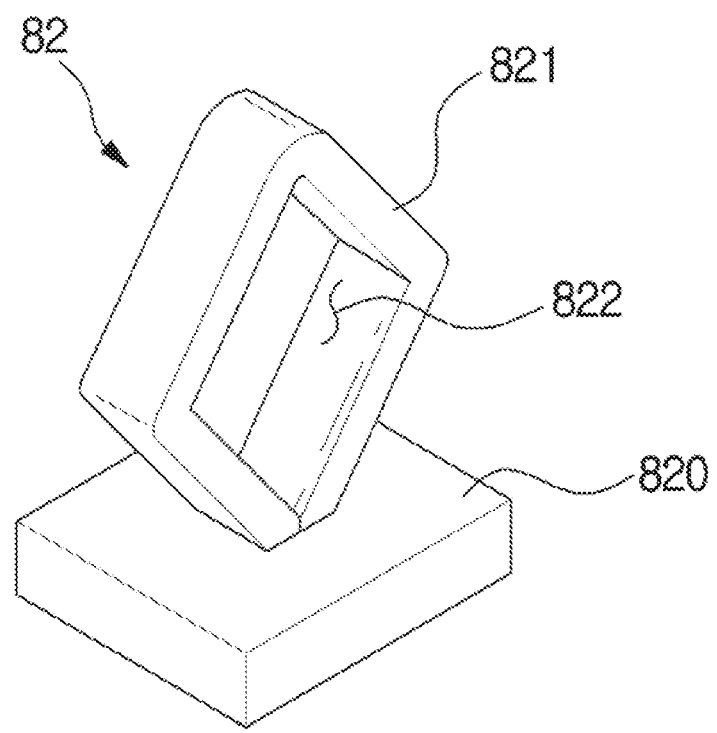
FIG. 4 is a view illustrating a coupling member in accordance with one exemplary embodiment.

FIGS. 3A to 3C are views illustrating how a heat sink assembly and a PCB are assembled in accordance with one exemplary embodiment, and FIG. 4 is a view illustrating a coupling member in accordance with one exemplary embodiment.

Referring to FIGS. 3A to 4, a heat sink assembly 90 in accordance with one exemplary embodiment may be installed on a PCB 80 by a coupling member 82. An IC member 81 serving as a CPU is provided on the PCB 80, and the heat sink assembly 90 may be installed to efficiently radiate the heat of the IC member 81. In addition, through the heat sink assembly 90, electromagnetic waves generated at a side of PCB 80 may be efficiently radiated, and the IC member 81 may be protected from static electricity.

The heat sink assembly 90 and the IC member 81 may be bonded by an adhesive member 92. The adhesive member 92 may be provided with a material having electrical conductivity and a high thermal conductivity. Since the heat sink assembly 90 and the IC member 81 are coupled by the adhesive member 92, high temperature heat generated at the IC member 81 may be quickly transferred to the heat sink assembly 90 and radiated.

A plurality of contact members 88 configured to make contact with the PCB 80 may be provided protruding from the heat sink assembly 90. The plurality of contact members 88 are separately provided and may be coupled to the PCB 80. The plurality of contact members 88 may be provided to be spaced apart from each other and evenly distributed on the PCB 80. The contact members 88 may be distributed with a higher density at a side of the IC member 81 which generates high temperature heat.

The contact members 88 may be provided with a metallic material having electrical conductivity and a high thermal conductivity. The contact members 88 may be provided with the same metallic material as that of the PCB 80.

In the exemplary embodiment described above, the plurality of contact members 88 are provided separately from the PCB 80 to be installed on the PCB 80, but the contact members 88 may be integrally formed with the PCB 80.

When the heat sink assembly 90 is coupled with the PCB 80 by the contact members 88, the electromagnetic waves generated from the electronic components provided on the PCB 80 and radiated outward may be suppressed. In addition, the IC member 81 may be protected from the static electricity since the static electricity generated at the heat sink assembly 90 may flow toward the PCB 80 instead of transferring to the IC member 81.

The plurality of contact members 88 are in contact with the heat sink assembly 90, and the heat of the PCB 80 may be quickly transferred toward the heat sink assembly 90 through the contact members 88. In this manner, the heat of the PCB 80 is transferred toward the heat sink assembly 90, and thereby, the heat of the PCB 80 can be radiated quickly.

The heat sink assembly 90 and the PCB 80 may be coupled by the coupling member 82. The coupling member 82 may be provided at the PCB 80. The coupling member 82 is manufactured separately from the PCB 80, and may be installed to one surface of the printed circuit board 80.

The coupling member 82 may include a base 820 installed on the PCB 80, and a support portion 821 provided to elastically support the heat sink assembly 90. The base 820 and the support portion 821 may be provided with a metallic material having a high thermal conductivity. The heat generated at the electronic components and transferred to the PCB 80, may be transferred to the heat sink assembly 90 through the coupling member 82.

A cable made of a metallic material having flexibility may be bent to form the support portion 821 in a polygonal shape of a closed loop. A closed space 822 formed by the polygonal shape may be provided in a center of the support portion 821. Even though the polygonal shape may be deformed by an external force, the support portion 821 may return to an original shape when the external force is removed.

In this manner, when the coupling member 82 is provided with the metallic material having a high thermal conductivity, the coupling member 82 may not only couple the PCB 80 and the heat sink assembly 90, but also simultaneously serve the role of the contact member 88. Accordingly, the number of the contact members 88 provided to increase the contact area between the PCB 80 and the heat sink assembly 90 may be reduced.

By coupling the PCB 80 and the heat sink assembly 90 using the coupling member 82 having electrical conductivity, static electricity may be prevented from being transferred toward the IC member 81, and electromagnetic waves may be prevented from being radiated to the outside. Further, since the heat transfer from the PCB 80 to the heat sink assembly 90 is provided to be transferable through the coupling member 82 having a high thermal conductivity, the number of the contact members 88 installed at the PCB 80 may be reduced. In the case that the contact member 88 is provided separately and installed at the PCB 80, a process of installing the contact member 88 on the PCB 80 may be reduced, thereby having advantages in manufacturing cost and process.

A fixing portion 91 in which the coupling member 82 is installed may be formed protruding from one surface of the heat sink assembly 90. The fixing portion 91 may be provided protruding from the heat sink assembly 90 to form a predetermined space. The support portion 821 may be inserted into the space formed by the fixing portion 91.

Specifically, the fixing portion 91 may include a first fixing portion 910 protruding from the one surface of the heat sink assembly 90, and a second fixing portion 911 bent from the first fixing portion 910. A pair of first fixing portions 910 may be spaced a predetermined distance from each other and may extend from the one surface of the heat sink assembly 90. The second fixing portion 911 may be provided to connect the pair of first fixing portions 910. The first fixing portion 910 and the second fixing portion 911 may be provided in a shape of a closed hook which is formed protruding from the one surface of the heat sink assembly 90.

The second fixing portion 911 may be bent with a steep slope from the first fixing portion 910. The first fixing portion 910 and the second fixing portion 911 may be provided to form one smooth curved surface.

As another example with respect to the shape of the fixing portion 91, the first fixing portion 910 may be provided so that a cross section of the first fixing portion 910 where the heat sink assembly 90 is coupled is formed to be a shape of a closed figure. That is, the first fixing portion 910 may be singularly provided and may protrude from one surface of the heat sink assembly 90 to form a closed curve at the one surface of the heat sink assembly 90. The second fixing portion 911 may be coupled to the first fixing portion 910 so that a space in which the coupling member 82 is inserted may be formed between the one surface of the heat sink assembly 90 and the second fixing portion 911.

The coupling member 82 may be installed at the fixing portion 91. The fixing portion 91 may be formed protruding from the one surface of the heat sink assembly 90 so that the support portion 821 is inserted and fixed in the space formed by the fixing portion 91. A shape of the fixing portion 91 is not limited to the exemplary embodiments described above.

An opening 913 into which the support portion 821 is inserted may be formed at the fixing portion 91. The opening 913 may be formed at the second fixing portion 911. The support portion 821 inserted through the opening 913 is provided so as not to depart from the opening 913 unless an external force is applied.

The support portion 821 is provided so that the shape thereof is deformable by an external force. Specifically, the support portion 821 may be provided to have elasticity contractible in a diameter direction so as to be deformable by an external force.

In a state without external force, a diameter w2 of the support portion 821 may be provided to be greater than a diameter w1 of the opening 913. A diameter w3 may be provided when an exterior force is applied to both sides of the support portion 821, which is smaller than the diameter w2 before the external force is applied.

When the external force applied to the support portion 821 is removed, the diameter of the support portion 821 may return to the shape before the external force is applied. That is, when the external force is removed, the diameter of the support portion 821 may return to the diameter w2 of the original state before the external force is applied.

As described above, since the diameter of the support portion 821 is provided to be contractible by an external force, the support portion 821 may have a smaller diameter by the external force and may pass through the opening 913 with the diameter w3 smaller than the diameter w1 of the opening 913. When the external force is removed after the support portion 821 passes through the opening 913, the support portion 821 may regain the original length of the diameter w2 which is longer than the diameter w1 of the opening 913 and returns to the original state before the external force is applied. When the diameter w2 of the support portion 821 returns to the original state which is greater than the diameter w1 of the opening 913, the support portion 821 may be fixed to the fixing portion 91 in a state of being inserted. Thus, the PCB 80 may be coupled with the heat sink assembly 90.

The support portion 821 inserted into the fixing portion 91 may elastically support the one surface of the heat sink assembly 90. When the heat sink assembly 90 is moved toward the PCB 80 by an external force, the impact to be given to the electronic components provided at the PCB 80 may be buffered by the elasticity of the support portion 821.

Since the IC member 81 provided at the PCB 80 is an essential constituent element which controls all operations of the display apparatus 1, the coupling member 82 may be located adjacent to the IC member 81 to elastically support the PCB 80 and the heat sink assembly 90 so that the IC member 81 is not damaged due to an external force.

In a conventional case, an elastic member is separately installed so that a coupling member which couples the PCB and the heat sink assembly may have elasticity. The coupling member is installed to pass through the PCB and the heat sink assembly, and the elastic member is provided to be installed to the coupling member to elastically support the PCB and the heat sink assembly.

In an exemplary embodiment of the present disclosure, the coupling member 82 is provided to have elasticity. Accordingly, the heat sink assembly 90 and the PCB 80 may be elastically supported without an elastic member. In an exemplary embodiment of the present disclosure, a material cost for manufacturing an elastic member can be saved, and a manufacturing process can be simplified since the assembling process needed for assembling the coupling member and an elastic member is omitted. Thereby, the manufacturing efficiency of the display apparatus 1 can be increased as compared to the conventional case.

Further, in the conventional case, since the coupling member is provided to pass through the PCB, a hole for the coupling member to pass through is formed at the PCB. A portion adjacent to the hole becomes a dead-space in which electronic components or the like may not be disposed. This is to prevent electronic components from being damaged due to interference when assembling the coupling member in the case that electronic components or the like are disposed at the portion adjacent to the hole.

In an exemplary embodiment of the present disclosure, an occurrence of dead space may be prevented since a hole for the coupling member to pass through the PCB is not formed. By preventing the occurrence of the dead space, it is possible to prevent the PCB from growing bigger than necessary due to the reduction of unnecessary space.

Figure 5:
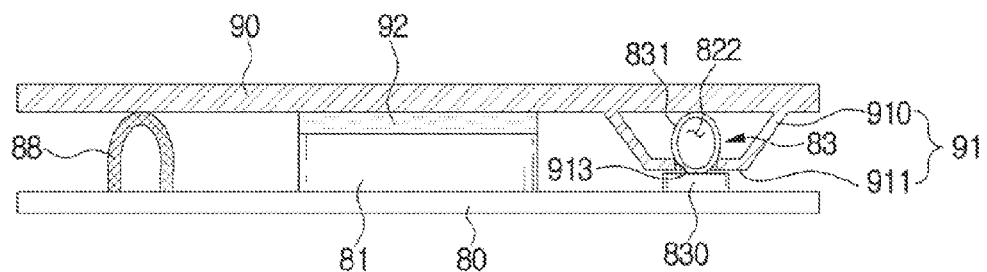
FIG. 5 is a view illustrating a heat sink assembly assembled with a PCB by a coupling member in accordance with another exemplary embodiment.
Figure 6:
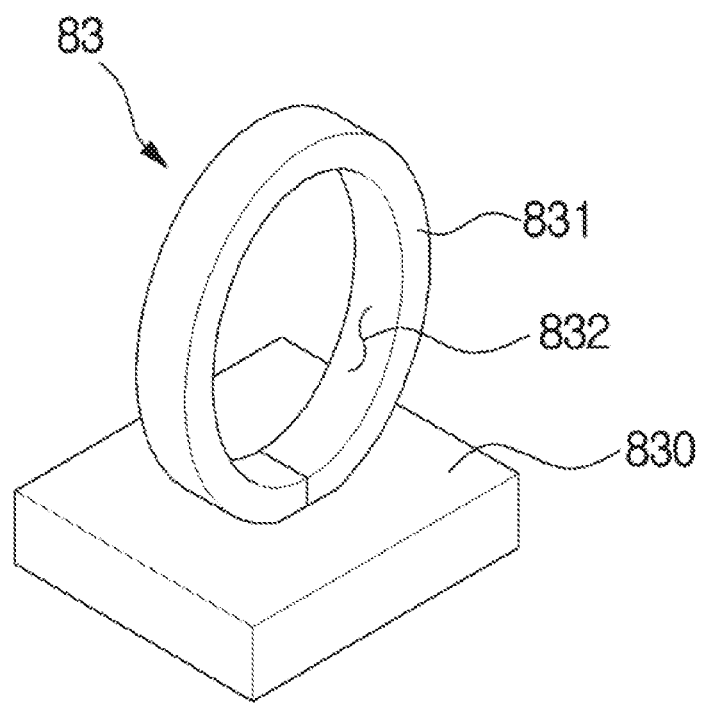
FIG. 6 is a view illustrating the coupling member in accordance with another exemplary embodiment.

FIG. 5 is a view illustrating a state in which a heat sink assembly and a PCB are coupled by a coupling member in accordance with another exemplary embodiment, and FIG. 6 is a view illustrating the coupling member in accordance with another exemplary embodiment.

Referring to FIGS. 5 and 6, a PCB 80 and a heat sink assembly 90 may be coupled by a coupling member 83 having a ring-shaped support portion 831. The coupling member 83 may include a base 830 to which the support portion 831 is coupled. The base 830 may be installed at the PCB 80. Inside the shape of the ring, a space 832 formed by a closed curve may be formed. Other configurations besides the support portion 831 will be applied similar to those described with FIGS. 3A to 4.

The ring-shaped support portion 831 may be provided with a metallic material having flexibility. The support portion 831 may be provided to be deformed by an external force and return to the original state when the external force is removed.

A fixing portion 91 in which an opening 913 is formed to have a smaller diameter than a diameter of the support portion 831 may be provided at one surface of the heat sink assembly 90, and the support portion 831 may pass through the opening 913 as the diameter thereof is contracted by an external force. When the external force is removed after the support portion 831 passes through the opening 913, the support portion 831 may return to have a greater diameter than the diameter of the opening 913. In this manner, the support portion 831 may be fixed to the fixing portion 91, and the heat sink assembly 90 and the PCB 80 may be coupled.

The coupling member 83 may elastically support the heat sink assembly 90. Even when an external force is applied to the heat sink assembly 90 or the PCB 80, an impact to be applied to the electronic components such as an IC member 81 and the like provided on the PCB 80 may be buffered by the elasticity of the coupling member 83.

Figure 7:
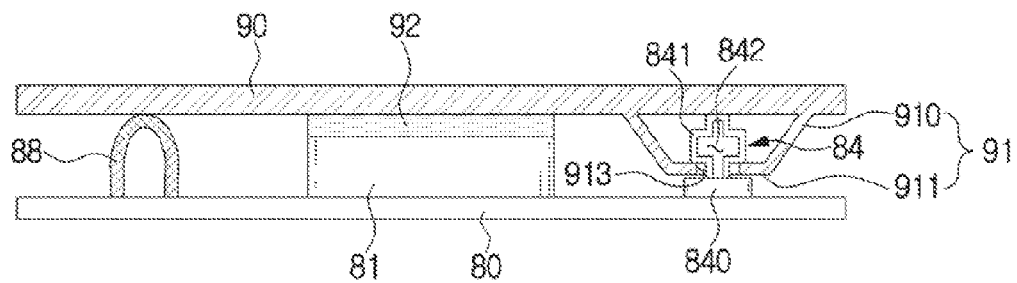
FIG. 7 is a view illustrating a heat sink assembly assembled with a PCB by a coupling member in accordance with still another exemplary embodiment.
Figure 8:
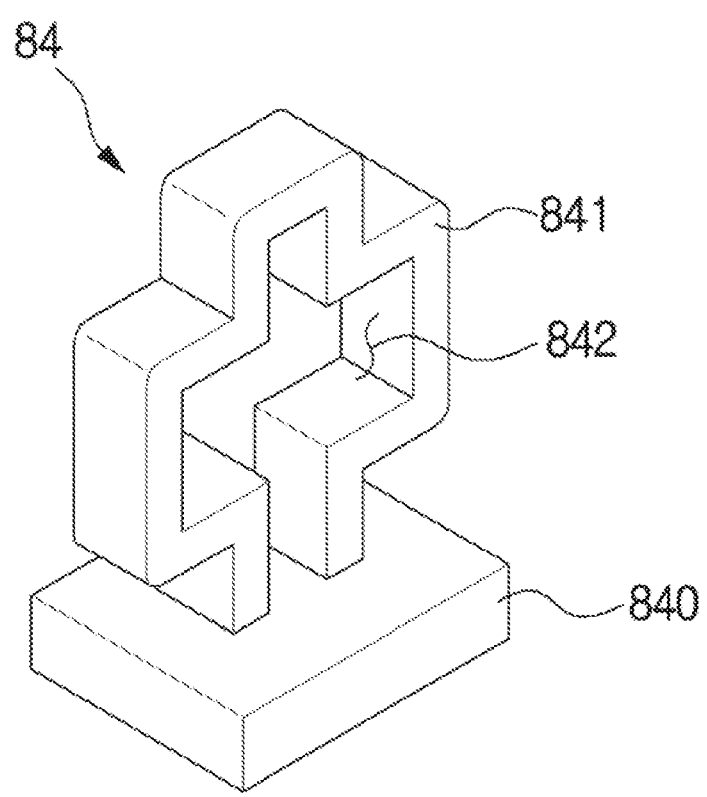
FIG. 8 is a view illustrating the coupling member in accordance with still another exemplary embodiment.

FIG. 7 is a view illustrating a state that a heat sink assembly and a PCB are coupled by a coupling member in accordance with still another exemplary embodiment, and FIG. 8 is a view illustrating the coupling member in accordance with still another exemplary embodiment.

Referring to FIGS. 7 and 8, a PCB 80 and a heat sink assembly 90 may be coupled by a coupling member 84 having a cross-shaped support portion 841. The coupling member 84 may include a base 840 to which the support portion 841 is coupled. The base 840 may be installed at the PCB 80. Inside the support portion 841, a space 842 formed by the cross-shaped closed curve may be formed. Other configurations besides the support portion 841 will be applied similar to those described with FIGS. 3A to 4.

The cross-shaped support portion 841 may be provided with a metallic material having flexibility. The support portion 841 may be provided to be deformed by an external force and return to the original state when the external force is removed.

A fixing portion 91 in which an opening 913 is formed to have a smaller diameter than a diameter of the support portion 841 may be formed at one surface of the heat sink assembly 90. Here, when a direction that the support portion 841 approaches the opening 913 is referred to as one direction, a maximum diameter of the support portion 841 may be the diameter of the support portion 841 extending in a direction perpendicular to the one direction. The support portion 841 may pass through the opening 913 as the diameter thereof is contracted by an external force.

When the external force is removed after the support portion 841 passes through the opening 913, the support portion 841 may return to have a greater diameter than the diameter of the opening 913. In this manner, the support portion 841 is fixed to the fixing portion 91, and the heat sink assembly 90 and the PCB 80 may be coupled.

The coupling member 84 may elastically support the heat sink assembly 90. Even when an external force is applied to the heat sink assembly 90 or the PCB 80, an impact to be applied to the electronic components such as an IC member 81 and the like provided on the PCB 80 may be buffered by the elasticity of the coupling member 84.

Figure 9:
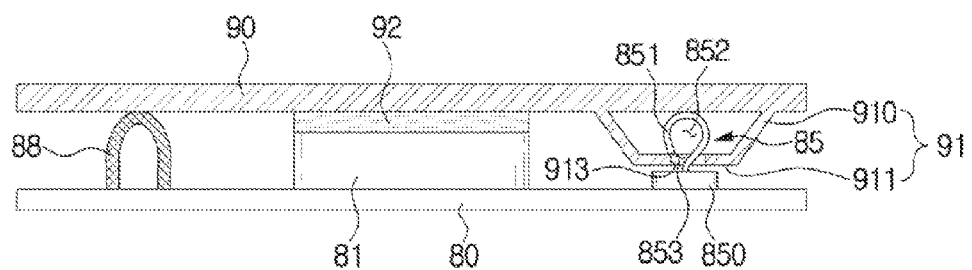
FIG. 9 is a view illustrating a heat sink assembly assembled with a PCB by a coupling member in accordance with yet another exemplary embodiment.
Figure 10:
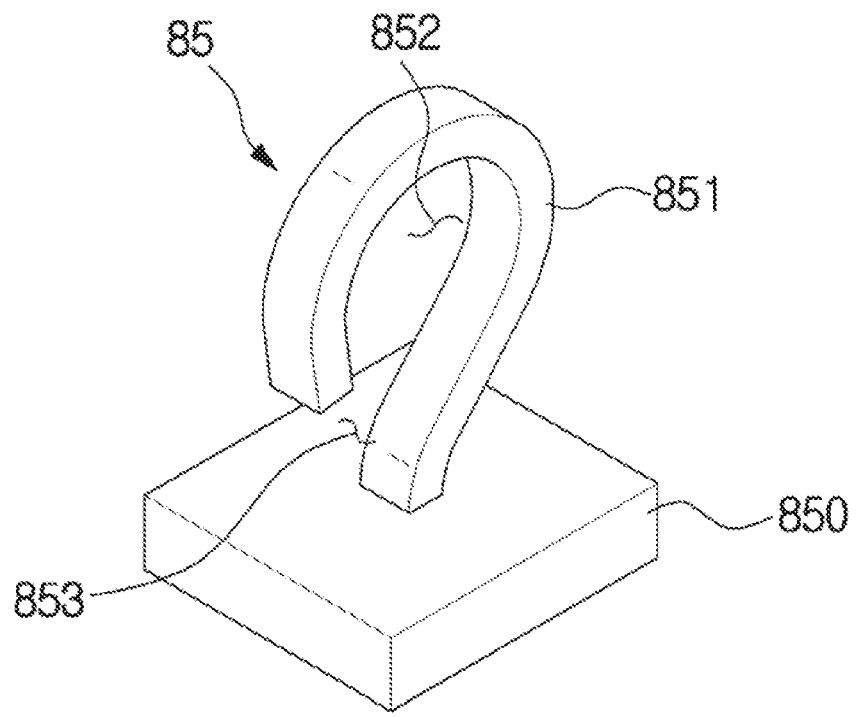
FIG. 10 is a view illustrating the coupling member in accordance with yet another exemplary embodiment.

FIG. 9 is a view illustrating a state that a heat sink assembly and a PCB are coupled by a coupling member in accordance with yet another exemplary embodiment, and FIG. 10 is a view illustrating a coupling member in accordance with yet another exemplary embodiment.

Referring to FIGS. 9 and 10, a PCB 80 and a heat sink assembly 90 may be coupled by a coupling member 85 having a hook-shaped support portion 851. The coupling member 85 may include a base 850 to which the support portion 851 is coupled. The base 850 may be installed on the PCB 80. Inside the support portion 851, a space 852 formed by the shape of the hook may be formed. Other configurations besides the support portion 851 will be applied similar to those described with FIGS. 3A to 4.

The hook-shaped support portion 851 may be provided with a metallic material having flexibility. The support portion 851 may be provided to be deformed by an external force and return to the original state when the external force is removed.

A fixing portion 91 in which an opening 913 is formed to have a smaller diameter than a diameter of the support portion 851 may be formed at one surface of the heat sink assembly 90. The support portion 851 may pass through the opening 913 as the diameter thereof is contracted by an external force.

When the external force is removed after the support portion 851 passes through the opening 913, the support portion 851 may return to have a greater diameter than the diameter of the opening 913. In this manner, the support portion 851 is fixed to the fixing portion 91, and the heat sink assembly 90 and the PCB 80 may be coupled.

The coupling member 85 may elastically support the heat sink assembly 90. Even when an external force is applied to the heat sink assembly 90 or the PCB 80, an impact to be applied to the electronic components such as an IC member 81 and the like provided on the PCB 80 may be buffered by the elasticity of the coupling member 85.

Figure 11:
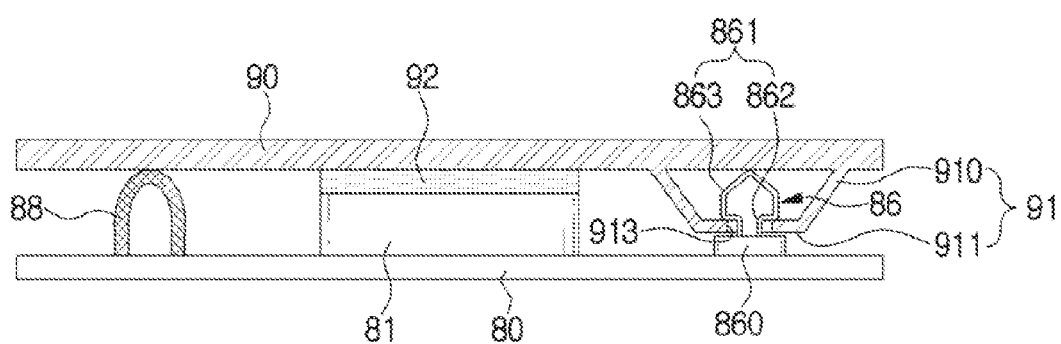
FIG. 11 is a view illustrating a heat sink assembly assembled with a PCB by a coupling member in accordance with yet another exemplary embodiment.
Figure 12:
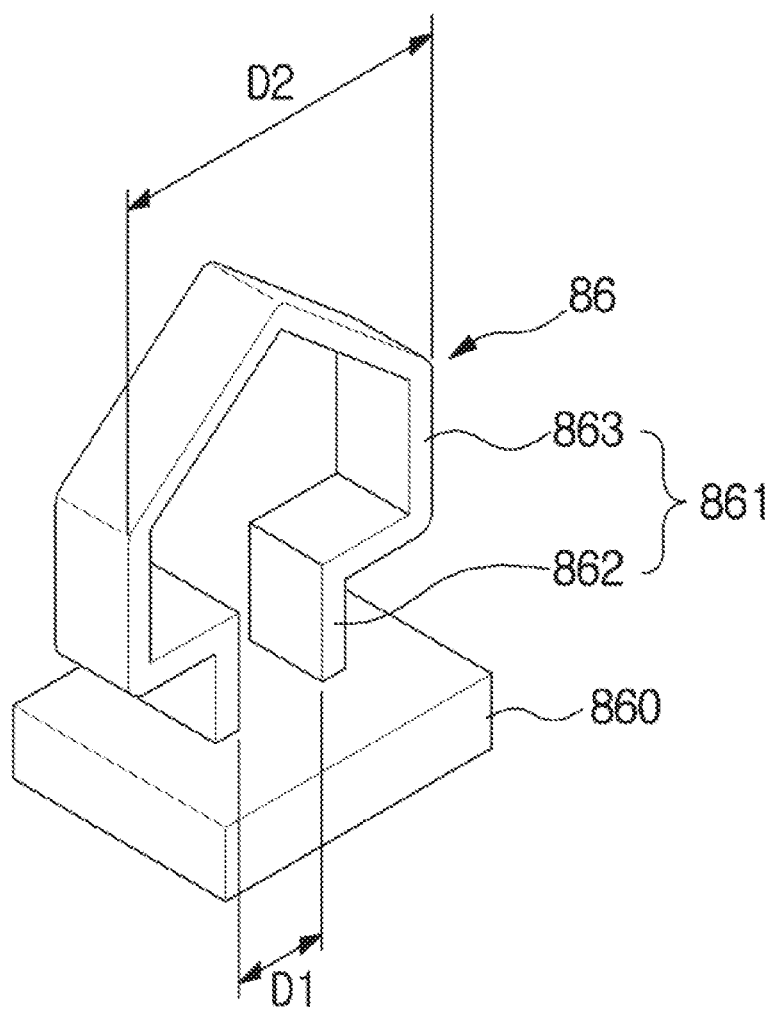
FIG. 12 is a view illustrating the coupling member in accordance with yet another exemplary embodiment.

FIG. 11 is a view illustrating a state that a heat sink assembly and a PCB are coupled by a coupling member in accordance with yet another exemplary embodiment, and FIG. 12 is a view illustrating the coupling member in accordance with yet another exemplary embodiment.

Referring to FIGS. 11 and 12, a coupling member 86 in accordance with yet another exemplary embodiment may include a base 860 and a support portion 861 having flexibility. The base 860 is fixed to a PCB 80, and the support portion 861 may be inserted and fixed to a fixing portion 91 provided at one surface of a heat sink assembly 90.

The support portion 861 may include a first support portion 862 extending from the base, and a second support portion 863 coupled to the first support portion 862 and having a diameter D2 greater than a diameter D1 of the first support portion 862. The first support portion 862 and the second support portion 863 may be integrally provided.

The diameter D1 of the first support portion 862 may be formed to be equal to or a bit smaller than a diameter of an opening 913 provided in the fixing portion 91. The diameter D2 of the second support portion 863 may be provided to be greater than the diameter of the opening 913.

A shape of the second support portion 863 is deformed by an external force, which allows the second support portion 863 to pass through the opening 913, and the shape of the second support portion 863 may return to the original state when the external force applied thereto is removed. As the diameter D2 of the second support portion 863 is greater than the diameter of the opening 913, the second support portion 863 may not depart from the opening 913. Therefore, the support portion 861 may be fixed to the fixing portion 91 of the heat sink assembly 90.

In this manner, the heat sink assembly 90 and the PCB 80 may be coupled by the coupling member 86. The coupling member 86 may elastically support the heat sink assembly 90. Since the heat sink assembly 90 and the PCB 80 are coupled by the conductive coupling member 86, problems occurring at an IC member 81 provided on the PCB 80 due to static electricity or electromagnetic waves may be prevented. Further, heat transfer may be efficiently performed from the PCB 80 to the heat sink assembly 90 as the coupling member 86 is provided with a metal having a high thermal conductivity.

Figure 13:
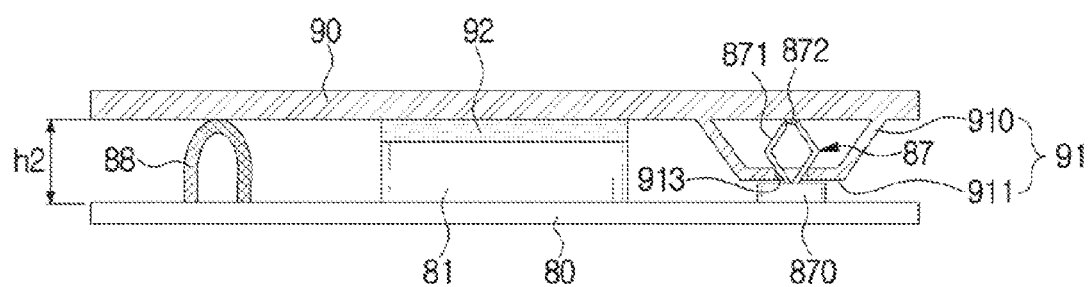
FIG. 13 is a view illustrating a heat sink assembly assembled with a PCB by a coupling member in accordance with yet another exemplary embodiment.
Figure 14:
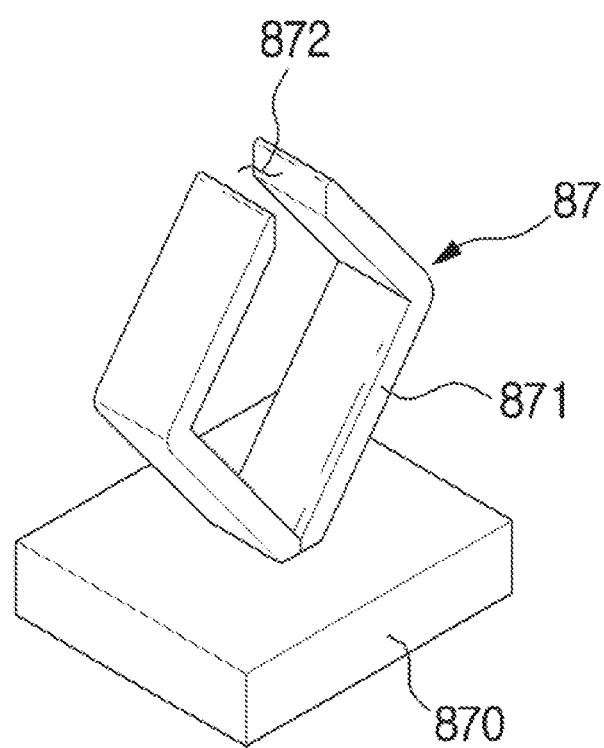
FIG. 14 is a view illustrating the coupling member in accordance with yet another exemplary embodiment.

FIG. 13 is a view illustrating a state that a heat sink assembly and a PCB are coupled by a coupling member in accordance with yet another exemplary embodiment, and FIG. 14 is a view illustrating the coupling member in accordance with yet another exemplary embodiment.

Referring to FIGS. 13 and 14, a coupling member 87 in accordance with yet another exemplary embodiment may include a base 870 installed at a PCB 80 and a support portion 871 coupled to the base 870. The coupling member 87 has a difference as compared to the coupling members in accordance with other exemplary embodiments in that an opening 872 is formed at an upper portion of the support portion 871 as illustrated in FIGS. 13 and 14. By providing the opening 872 at the upper portion of the support portion 871, the coupling member 87 may be easily installed and moved at an apparatus that moves the coupling member 87.

Although the opening 872 is illustrated to be formed at the upper portion of the support portion 871 of the coupling member 87 in FIGS. 13 and 14, it may also provide a flat surface at the upper portion of the support portion to facilitate the coupling member to be installed at the apparatus that moves the coupling member.

A shape of the coupling member is not limited to the exemplary embodiment described above. The coupling member may be provided with a metallic material having high heat transfer efficiency. The coupling member is provided to elastically support the PCB and the heat sink assembly by its own shape.

In the above descriptions, the base of the coupling member is installed at the PCB and the support portion is installed at the fixing portion provided at the heat sink assembly, but another exemplary embodiment in which the base of the coupling member is installed at the heat sink assembly and the support portion is installed to the fixing portion provided at the PCB is also possible.

The description above was related to the PCB and the heat sink assembly provided in a display apparatus, but the structure of coupling a PCB to a heat sink assembly by a coupling member can be applied to any electronic apparatus which has a PCB and a heat sink assembly.

As is apparent from the above description, according to the display apparatus and the electronic apparatus which include the heat sink assembly in accordance with an exemplary embodiment, a manufacturing cost of the coupling member which couples the heat sink assembly and the PCB can be reduced.

In addition, since the heat sink assembly and the PCB are coupled by the coupling member having an electrical conductivity, electromagnetic waves can be prevented from radiating from the PCB, and the IC member installed at the PCB can be prevented from being damaged by static electricity.

Further, since the PCB and the heat sink assembly are coupled by the coupling member having a high thermal conductivity, heat generated at the electronic components of the PCB can be radiated quickly.

Although a few exemplary embodiments of the present disclosure have been shown and described, it should be appreciated by those skilled in the art that changes may be made in these exemplary embodiments without departing from the principles and spirit of the disclosure, the scope of which is defined in the claims and their equivalents.

What is claimed is:

1. An electronic apparatus comprising:
    a printed circuit board (PCB) comprising a plurality of electronic components;
    a heat sink assembly coupled to the PCB; and
    an elastically deformable coupling member which couples the heat sink assembly and the PCB,
    wherein the elastically deformable coupling member comprises a flexible metallic material, and is oriented to elastically support the PCB and the heat sink assembly, and
    wherein the heat sink assembly comprises a fixing portion that protrudes from a surface thereof toward the PCB, and wherein the elastically deformable coupling member is fixed to the fixing portion.

2. The electronic apparatus of claim 1, wherein a diameter of the elastically deformable coupling member is contractible by an external force.

3. The electronic apparatus of claim 1, wherein the fixing portion and the heat sink assembly define a space, and wherein the elastically deformable coupling member is inserted within the space.

4. The electronic apparatus of claim 3, wherein the fixing portion comprises an opening formed in a surface thereof, and wherein the elastically deformable coupling member is inserted through the opening.

5. The electronic apparatus of claim 4, wherein a diameter of the opening is less than the diameter of the elastically deformable coupling member.

6. The electronic apparatus of claim 3, wherein the elastically deformable coupling member is inserted into the space formed between the fixing portion and the heat sink assembly so as to elastically support the heat sink assembly.

7. The electronic apparatus of claim 1, wherein the elastically deformable coupling member is fixed to the PCB.

8. The electronic apparatus of claim 7, wherein the elastically deformable coupling member comprises a base member in contact with the PCB, and a support portion in contact with both the base member and the heat sink assembly so as to support a surface of the heat sink assembly.

9. The electronic apparatus of claim 8, wherein the support portion comprises a closed loop having a polygonal shape.

10. The electronic apparatus of claim 8, wherein the support portion comprises a ring shape.

11. The electronic apparatus of claim 8, wherein the support portion comprises an open loop having a hook shape.

12. The electronic apparatus of claim 1, wherein the elastically deformable coupling member and the PCB comprise a common metallic material.

13. The electronic apparatus of claim 1, wherein the plurality of electronic components comprises an integrated circuit (IC) member configured to function as a central processing unit, and wherein the elastically deformable coupling member is located adjacent to the IC member.

14. The electronic apparatus of claim 13, wherein the IC member and the heat sink assembly are coupled to each other by an adhesive member.

15. An electronic apparatus comprising:
    a printed circuit board (PCB) comprising a plurality of electronic components;
    a heat sink assembly coupled to the PCB;
    a plurality of contact members protruding from the PCB; and
    an elastically deformable coupling member which couples the heat sink assembly and the PCB,
    wherein the elastically deformable coupling member comprises a flexible metallic material, and is oriented to elastically support the PCB and the heat sink assembly, and
    wherein the plurality of contact members are in contact with one surface of the heat sink assembly coupled with the PCB.

16. The electronic apparatus of claim 15, wherein the elastically deformable coupling member projects from and is attached to a surface of the PCB, and is elastically deformed when inserted into the heat sink assembly.

17. A display apparatus comprising:
a display panel configured to display images;
a printed circuit board (PCB) comprising a plurality of electronic components and located in a rear of the display panel
a heat sink assembly configured to radiate heat of the PCB; and
an elastically deformable coupling member which couples the heat sink assembly and the PCB,
wherein the elastically deformable coupling member comprises a flexible metallic material, and is oriented to elastically support the heat sink assembly, and
wherein the heat sink assembly comprises a fixing portion that protrudes from a portion thereof toward the PCB, and wherein the elastically deformable coupling member is fixed to the fixing portion.

18. The display apparatus of claim 17, wherein the fixing portion comprises an opening formed in a surface thereof, and wherein the elastically deformable coupling member is inserted through the opening.

19. The display apparatus of claim 18, wherein a diameter of the opening is less than a diameter of the elastically deformable coupling member.

* * * * *